(12) United States Patent
Nagaraj et al.

(10) Patent No.: US 8,130,526 B2
(45) Date of Patent: Mar. 6, 2012

(54) PROGRAMMING A MICROCHIP ID REGISTER

(75) Inventors: Kelageri Nagaraj, Hubli (IN); Kenneth Pichamuthu, Bangalore (IN); Prakash Venkitaraman, Bangalore (IN); Baalaji Ramamoorthy Konda, Bangalore (IN); Hari Krishnan Rajeev, Kerala (IN)

(73) Assignee: International Business Machines Corporation, Armonk, NY (US)

( * ) Notice: Subject to any disclaimer, the term of this patent is extended or adjusted under 35 U.S.C. 154(b) by 1088 days.

(21) Appl. No.: 11/837,255

(22) Filed: Aug. 10, 2007

(65) Prior Publication Data

US 2009/0039347 A1 Feb. 12, 2009

(51) Int. Cl.
*G11C 5/02* (2006.01)

(52) U.S. Cl. .............. 365/51; 365/189.03; 257/E21.506

(58) Field of Classification Search .............. 365/51, 365/189.03, 189.12, 225.7; 257/E21.506
See application file for complete search history.

(56) References Cited

U.S. PATENT DOCUMENTS

| | | | |
|---|---|---|---|
| 6,393,504 B1 | 5/2002 | Leung et al. | |
| 6,446,221 B1 | 9/2002 | Jaggar et al. | |
| 6,535,450 B1 * | 3/2003 | Ryan et al. | 365/230.03 |
| 6,785,841 B2 | 8/2004 | Akrout et al. | |
| 6,848,068 B1 | 1/2005 | Liu | |
| 6,922,820 B1 | 7/2005 | Lulla et al. | |
| 7,046,536 B2 * | 5/2006 | Roohparvar | 365/45 |
| 7,512,760 B2 * | 3/2009 | Takami | 711/163 |
| 2006/0158916 A1 | 7/2006 | Roohparvar | |

OTHER PUBLICATIONS

In-System Programming Usage Guidelines for ispJTAG Devices, Lattice Semiconductor Corporation, Feb. 2002.
Mehta, K.K. and Randa, V.T., FPGA Implementation and Testing of VXIbus Interface Hardware, IEEE, 2005.
Max II Device Handbook, Section 4, Altera Corporation, Dec. 2006.
Groza, Voicu et al., "Run-Time Reconfigurable System-on-Chip", IMTC 2005, Instrumentation and Measurement Technology Conference, Ottawa, Canada, May 17-19, 2005, pp. 322-326.

* cited by examiner

*Primary Examiner* — VanThu Nguyen
(74) *Attorney, Agent, or Firm* — Grant A. Johnson

(57) ABSTRACT

A method is disclosed for programming an ID register of a microchip. The method comprises the step, prior to packaging, of attaching at least one additional ID pin to the die of the microchip. The at least one pin being so attached that, when the microchip is packaged, the at least one pin is sealed within the package. At least a portion of the microchip identity data is programmed by providing a plurality of unique combinations of binary data to the at least one additional pin. Each unique combination of binary data corresponds to a unique identity of the microchip. The at least one pin is coupled to a respective module of the microchip layout for providing, via the at least one pin, information associated with the particular identity of the microchip. The at least one pin is also coupled to the identification register, so as to, upon testing, include the respective combination of binary data in the ID register data of the microchip.

10 Claims, 3 Drawing Sheets

PROGRAMMING A MICROCHIP ID REGISTER

TECHNICAL FIELD

The present invention relates to identification code registers of microchips. In particular, the invention relates to a method and a system for programming the identification code registers of a multi-functional microchips.

BACKGROUND OF THE INVENTION

Increasing number of modern electronic appliances use microchips. To allow easy identification, most microchips include a "device identification (ID) register" where important identification information about the respective microchip, such as place of manufacture, batch number and design version, is permanently stored in a binary form.

Shown in FIG. 1 is a typical vendor-defined ID register code configuration 100 containing four fields. In particular, the 32-bit identification code shown in FIG. 1 contains '1' in its less significant bit (LSB) section 101. In the second section 102, bits 1 to 11 include an 11-bit manufacturer-identity code, which in this case is a compressed version of the code specified by the Electronic Industries Association/Joint Electron Device Council (EIA/JEDEC). Bits 12 to 27, in section 104 of the code 100, represent a 16-bit part number that is often used to verify the type of microchip inserted in a particular location of an assembled product. Bits 28 to 31, of section 106 of the code, represent the device (microchip) version number, which indicates the specific version of the microchip, in cases where several versions are available.

To facilitate subsequent output of the ID register code, the ID register data is processed by a shift-register (not shown). In particular, the device ID register is set so that, once the "Capture-Data Register" state of the controller (not shown) triggers an interrogation of the ID register, subsequent clocking of the shift register causes the identification code to be presented in serial form at the test data out (TDO) output of the shift register.

Shown in FIG. 2 is a single device ID register cell 200, which includes a memory element 202. The memory element 202 receives its data input from a multiplexer 204, which effectively selects between the bit 206, representing the ID code, and the output 208 from a previous ID register cell, not shown. The input 210 provides the control signal to the multiplexer 204, while the clock input 212 drives the memory element 202.

FIG. 3 shows a typical hard-coded hardware implementation of a 32 bit ID code register 300. Whilst the memory elements here are represented by LPH latches 302, it would be obvious to a skilled addressee that other types of latches can also be used. The data input to the latches is provided by respective multiplexers 304. The inputs to the multiplexers 304, on the other hand, are provided by the test-data-in (TDI) signal 306 and the ID code data 308 (IDCODE_31 to IDCODE_0). The input 310 (SHIFT DR) provides control signal to the multiplexers 304. The ID code data 308 is obtained from a data bus output from the Device ID code register, where the ID data is hard-coded.

As discussed above, well established methods for programming and reading of the ID data registers of microchips exist in the art. However, there have been recent developments in the microchip manufacturing towards integration of multiple functions with sharable core design within a single microchip. It should be noted here that the term "core" here is used to indicate the identical unit of logic, or microchip layout design, shared by identical microchips regardless of their specific programming and application. Such multi-functionality allows identical microchips to be used in a plurality of applications and devices, each having specific features targeted towards a specific market segment. This represents a cost effective approach to a bulk-volume production.

The identification of the multiple functionalities of such microchips has so far been implemented by adding informational digits to the ID register and introducing additional pins to the microchip package, for programming these digits. As discussed previously, during testing, the ID register is interrogated and the unique combination of digits, including the additional function-defining digits, is obtained to verify the identity of the microchip.

One disadvantage is related to the fact that the increased number of pins adds complexity to the packaging stage. A further disadvantage relates to the fact that, since the pins are readily accessible, the device is vulnerable to back-engineering.

Accordingly, it is desirable to develop a method and a system for programming the identification register of such microchips, which helps alleviate at least some the above disadvantages or to offer a useful alternative.

SUMMARY OF THE INVENTION

According to one aspect of the invention, there is provided a method of programming an ID register of a microchip comprising a die and a core. The method includes, prior to packaging, attaching at least one additional pin to the die. The at least one pin is so attached that, when the microchip is packaged, the at least one pin is sealed within the package. At least a portion of the microchip identity data is programmed by recording a predetermined combination, out of a plurality of predetermined combinations of binary data, onto the at least one additional pin. The predetermined combination of binary data defines an identity of the microchip. At least one pin is connected to the core for providing information associated with the identity of the microchip. Electronic output of the data programmed in the at least one pin is provided so as to allow verification of the identity of the microchip.

Preferably, the electronic output is provided by connecting the at least one pin to the device identification register, so as to include the respective combination of binary data in the ID register data set of the microchip. Also preferably, the at least one pin includes 2 pins for identifying four different identities. In some embodiments, the identity of the microchip is associated with a particular one, out of a plurality of predetermined functionalities and/or applications of the microchip.

According to another aspect of the invention, there is provided a microchip having a die, a core and at least one additional ID pin. The at least one additional ID pin is attached to the die and sealed within the package. The at least one pin is used to program at least a portion of the microchip identity data by providing a predetermined combination of binary, out of a plurality of predetermined combinations of binary data, to the at least one additional ID pin. The unique combination of binary data defines the identity of the microchip. The at least one ID pin is connected to the core for providing information associated with the identity of the microchip. The data stored at the at least one ID pin is arranged to be output, so as to allow verification of the identity of the microchip.

Preferably, the at least one ID pin is also coupled to the device identification register, so as, upon testing, to include the respective combination of binary data in the ID register data set of the microchip. Even more preferably, the identity of the microchip is associated with a particular one, out of a plurality of predetermined functionalities and/or applications of the microchip.

According to a further aspect of the invention, there is provided an electronic device comprising a microchip having a die, a core and at least one additional ID pin. The at least one additional ID pin is attached to the die and sealed within the package. The at least one pin is used to program at least a portion of the microchip identity data by providing a predetermined combination of binary, out of a plurality of predetermined combinations of binary data, to the at least one additional ID pin. The unique combination of binary data defines the identity of the microchip. The at least one ID pin is coupled to the core for providing information associated with the identity of the microchip. The data stored at the at least one ID pin is arranged to be output, so as to allow verification of the identity of the microchip.

Preferably, the at least one ID pin is also coupled to the device identification register, so as, upon testing, to include the respective combination of binary data in the ID register data set of the microchip. Even more preferably, the identity of the microchip is associated with a particular one, out of a plurality of predetermined functionalities and/or applications of the microchip.

DETAILED DESCRIPTION OF THE PREFERRED EMBODIMENTS

Figure 1:
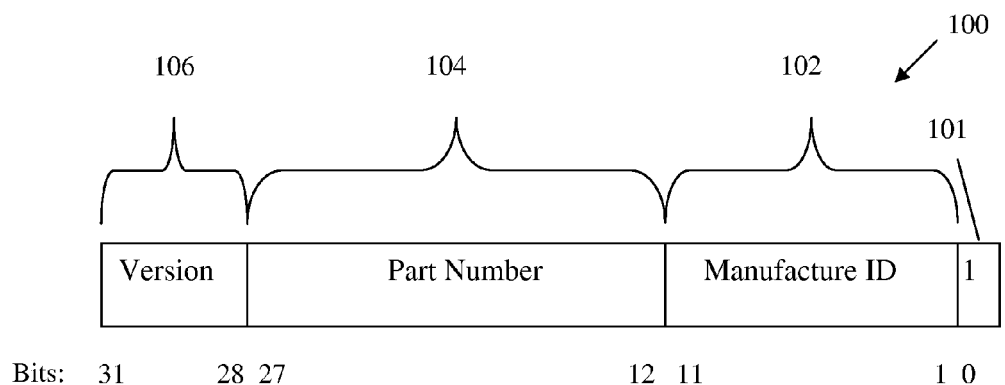
FIG. 1 is a schematic diagram of the structure of a microchip identification code.
Figure 2:
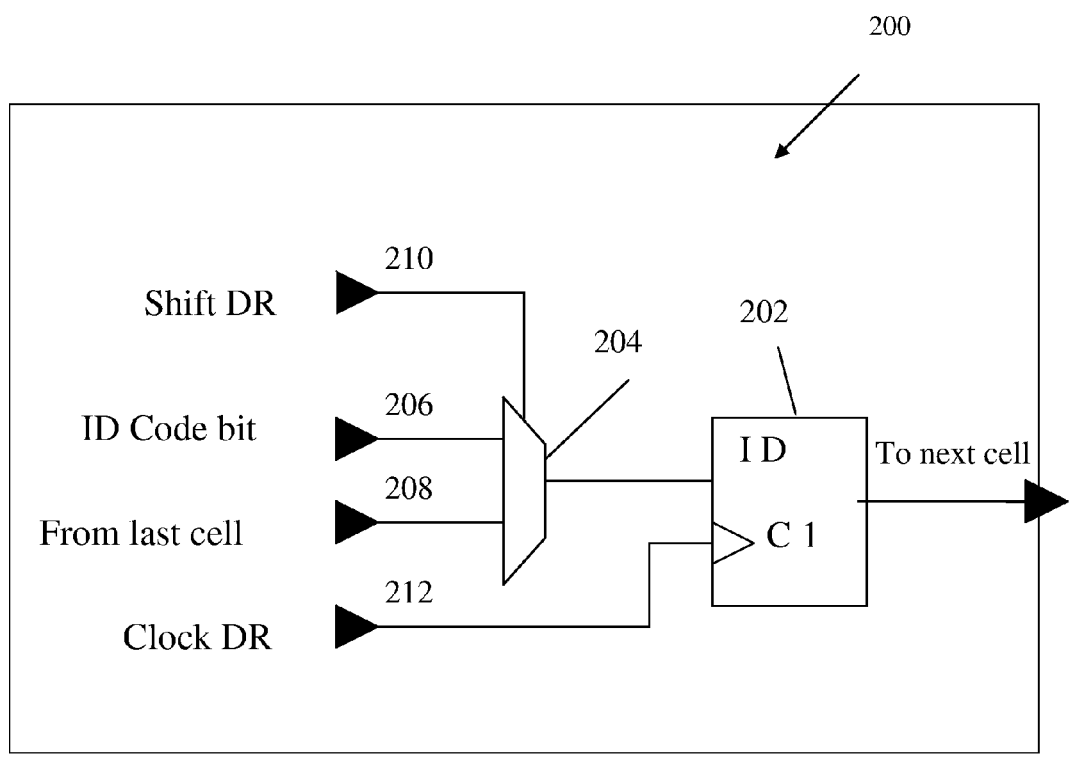
FIG. 2 is a schematic block diagram of a single cell within a typical microchip identification register.
Figure 3:
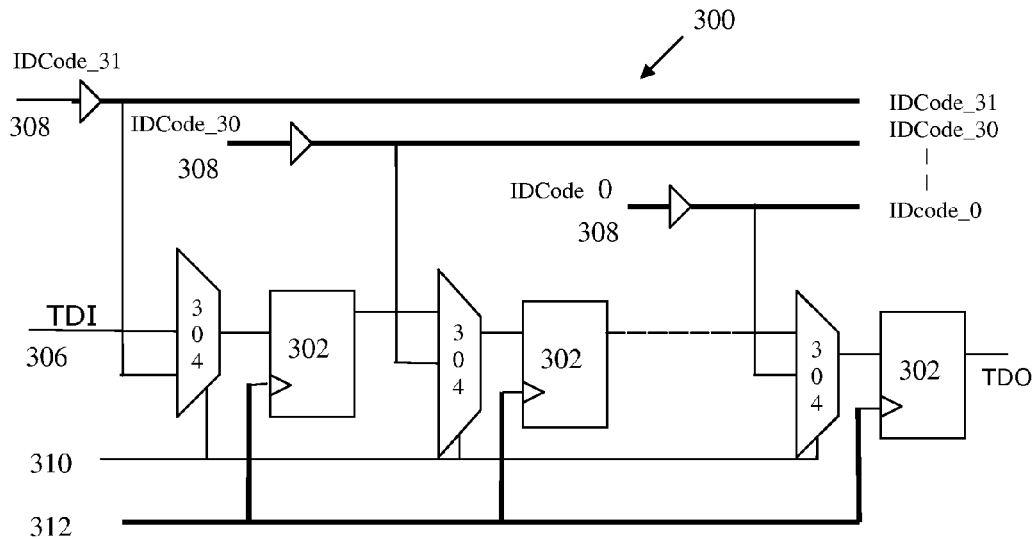
FIG. 3 is a schematic block diagram of a typical 32-bit device identification register.
Figure 4:
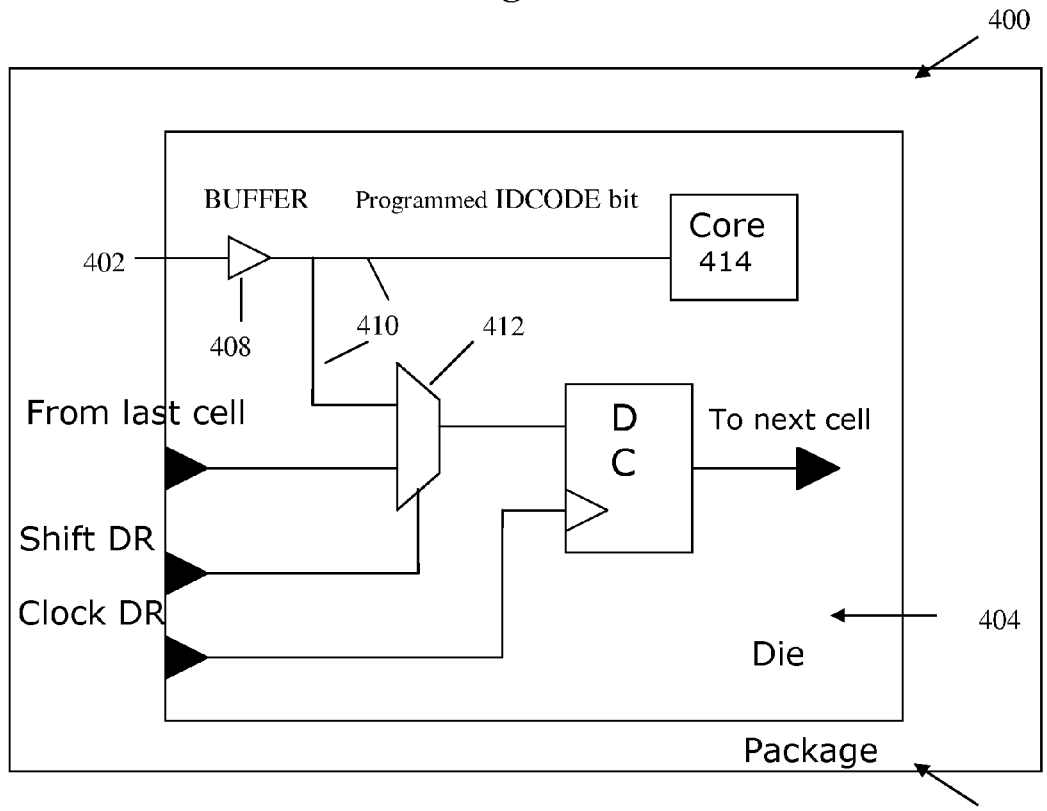
FIG. 4 is a schematic block diagram of a single cell of a device identification register, embodying the present invention.

A schematic block diagram of a single cell 400 of a device identification register, according to an exemplary embodiment, is illustrated in FIG. 4. Die 404 in FIG. 4 is a rectangular block of silicon wafer. A pin 402 is provided that protrudes out of the die 404, but not out of the package 406. The pin 402 is coupled with a buffer 408, which feeds an input 410 of a multiplexer 412. The same input 410 also is sent to, and decoded by, the core design 414 to facilitate the selection of the corresponding $2^X$ number of device functions in the design, where X is the number of pins 402. Having the pins 402 enclosed within the package simplifies the packaging process and provides the manufacturer with the advantage of programming before fabrication of the entire package. This ensures that only the manufacturer has complete control of the programmability of the microchip ID. In addition, depending on the customer specification, a manufacturer can configure a single batch of dices for multiple applications.

Example

The implementation of the above discussed system is illustrated with the following example, which presents 4 microchips in one design: 64 port, 32 port, 24 port and a 12 port microchip device. A device identification code required for each port device is as follows;

64 port device: 0000001001010010000100001001001, $13^{th}$ bit=0, $12^{th}$ bit=1

32 port device: 0000001001010010001000001001001, 13th bit=1, $12^{th}$ bit=0

24 port device: 0000001001010010001100001001001, $13^{th}$ bit=1, $12^{th}$ bit=1

12 port device: 0000001001010010000000001001001, $13^{th}$ bit=0, $12^{th}$ bit=0

Figure 5:
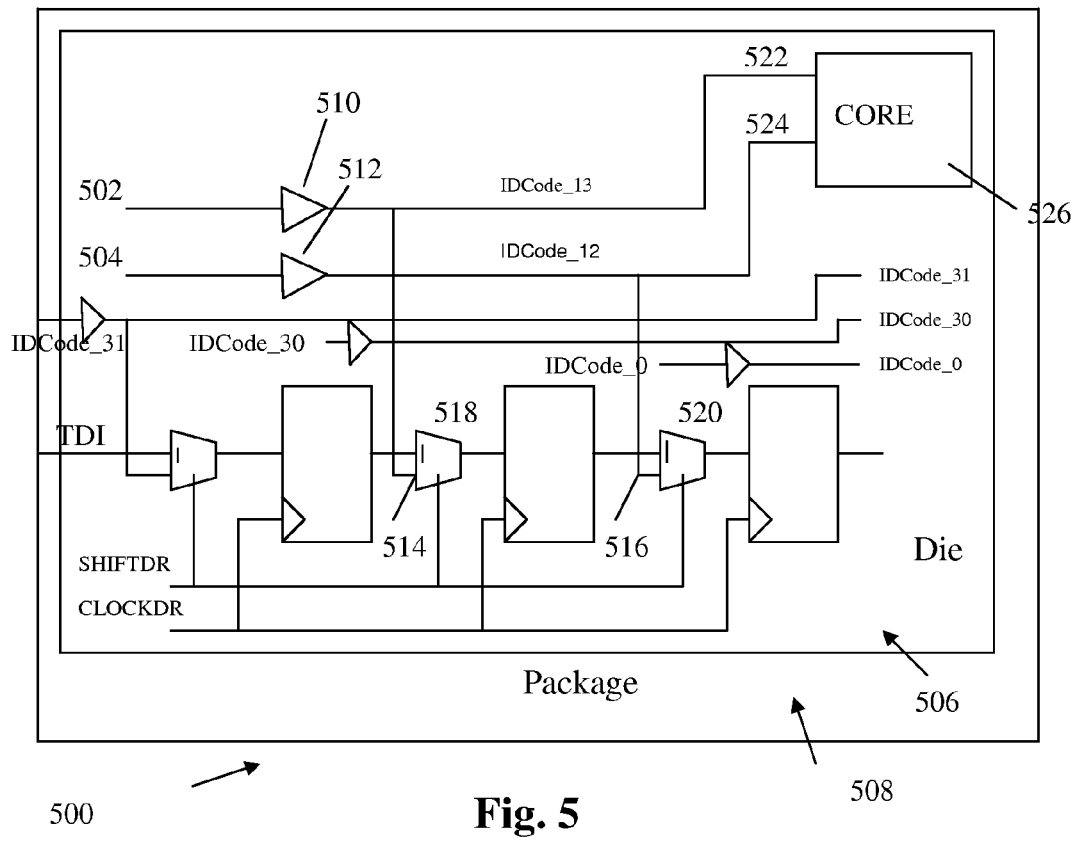
FIG. 5 is a schematic block diagram of a 32-bit device identification register, embodying the invention.

FIG. 5 illustrates schematically a microchip 500 having complete ID registers that implements the above codes. The pins 502 and 504 extend out of the die 506, but not out of the package 508. Each pin is coupled to a corresponding buffer 510 or 512. These buffers feed inputs 514 and 516 of a multiplexer 518 and a multiplexer 520, respectively. The same data also is sent to inputs 522 and 524 of the core design 526, where the data is decoded to select the corresponding 64-port, 32-port, 24-port or 12-port device in the design.

If, for example, the 64-bit-port device is to be selected, the input 514 of the multiplexer 518 is grounded, whilst the pin 516 of the multiplexer 520 is connected to the power supply line of on the die 516. The inputs 514 and 516 are set to 0 and 1, respectively. In this case, the microchip ID code register will have a unique part number that corresponds to the 64 port device in the above design.

The ID register data of microchips with alternative number of bits is shown in Table 1 below. All the 16 bits of the Device ID Code register dedicated to the part number are also connected to the Core design so as to select the particular type of device.

TABLE 1

| Device | X1 | X2 |
| --- | --- | --- |
| 64 bit | 1 | 0 |
| 32 bit | 0 | 1 |
| 24 bit | 1 | 1 |
| 12 bit | 0 | 0 |

It should be noted here that whilst the above described embodiment of the invention is directed to a JTAG compliant ID code, it should be apparent to a person skilled in the art that the basic concepts of this invention are applicable to JTAG non-compliant devices as well. JTAG stands for "Joint Test Action Group" and refers to a specific standard (also known as "IEEE Standard 1149.1") specifying how to control and monitor the pins of compliant devices on a printed circuit board. Any JTAG non-compliant device can also implement the secure programmability at the post-die, pre-package, fabrication stage. Again, this requires implementation of an N-bit register where N bits can be used to select one or more of the $2^N$ functions fabricated on the die. The read-only register inputs are configured to identify the device ID, as per the requirements at pre-package and post-die fabrication stage.

Figure 6:
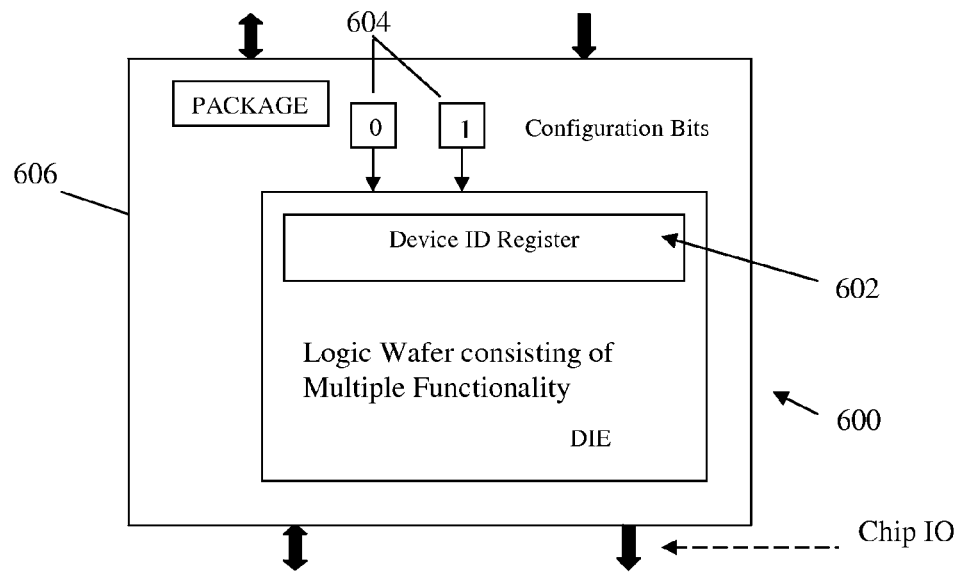
FIG. 6 is a schematic diagram of a microchip with a pre-packaging programmability, embodying the invention.

FIG. 6 shows a microchip 600 having a multifunctional die 600 and an n-bit read-only ID register 602. Input terminals 604 are used to program the respective ID code into the configuration register 602 at a pre-packaging stage. The particular ID code programmed into the register 602 corresponds to a particular functionality on the die. As a result, by programming the register 602, one particular functionality can be selected out of the multiple functionalities permitted by the physical structure of the die.

It is apparent from the above description that the method and the system of the embodiment of the invention offer certain advantages to microchip manufacturers. Efficient use of multiple core designs with a common interface significantly reduces the cost of development and production, by allowing bulk implementation of logic on wafer. Control programmability is achieved at pre-packaging level, which allows a selective segment of a market region to be targeted. Misuse of the microchip by back-engineering or unauthorized enabling of hidden functionality is minimized, since the respective pins associated with interrogating the microchip's ID register are sealed within the package.

We claim:

1. A method of programming an ID register of a microchip, the microchip comprising a die and a core, the method comprising, prior to packaging:
   attaching at least one additional pin to the die, the at least one pin being so attached that, when the microchip is packaged, the at least one pin is sealed within the package;
   programming at least a portion of the microchip identity data by recording a predetermined combination, out of a plurality of predetermined combinations of binary data, onto the at least one additional pin, the predetermined combination of binary data defining an identity of the microchip;
   connecting the at least one pin to the core for providing information associated with the identity of the microchip; and
   providing for electronic output of the data programmed in the at least one pin so as to allow verification of the identity of the microchip.

2. The method of claim 1, wherein the electronic output is provided by connecting the at least one pin to the device identification register, so as to include the respective combination of binary data in the ID register data set of the microchip.

3. The method of claim 1, wherein the at least one pin includes 2 pins for identifying four different identities.

4. The method of claim 1, wherein the identity of the microchip is associated with a particular one, out of a plurality of predetermined functionalities and/or applications of the microchip.

5. A microchip having a die, a core and at least one additional ID pin, the at least one additional ID pin being attached to the die and sealed within the package, the at least one pin being used to program at least a portion of the microchip identity data by providing a predetermined combination of binary, out of a plurality of predetermined combinations of binary data, to the at least one additional ID pin, the unique combination of binary data defining the identity of the microchip, the at least one ID pin being coupled to the core for providing information associated with the identity of the microchip, the data stored at the at least one ID pin being arranged to be output, so as to allow verification of the identity of the microchip.

6. The microchip of claim 5, wherein the at least one ID pin is also coupled to the device identification register, so as to, upon testing, include the respective combination of binary data in the ID register data set of the microchip.

7. The microchip of claim 5, wherein the identity of the microchip is associated with a particular one, out of a plurality of predetermined functionalities and/or applications of the microchip.

8. An electronic device comprising a microchip having a die, a core and at least one additional ID pin, the at least one additional ID pin being attached to the die and sealed within the package, the at least one pin being used to program at least a portion of the microchip identity data by providing a predetermined combination of binary, out of a plurality of predetermined combinations of binary data, to the at least one additional ID pin, the unique combination of binary data defining the identity of the microchip, the at least one ID pin being coupled to the core for providing information associated with the identity of the microchip, the data stored at the at least one ID pin being arranged to be output, so as to allow verification of the identity of the microchip.

9. An electronic device of claim 8, wherein the at least one ID pin is also coupled to the device identification register, so as to, upon testing, include the respective combination of binary data in the ID register data set of the microchip.

10. The electronic device of claim 8, wherein the identity of the microchip is associated with a particular one, out of a plurality of predetermined functionalities and/or applications of the microchip.

* * * * *